United States Patent

Iravani

[11] Patent Number: 5,963,101
[45] Date of Patent: *Oct. 5, 1999

[54] VCO WITH LOCAL FEEDBACK FOR LOW POWER SUPPLY NOISE SENSITIVITY

[75] Inventor: Kamran Iravani, San Jose, Calif.

[73] Assignee: VLSI Technology, Inc., San Jose, Calif.

[*] Notice: This patent is subject to a terminal disclaimer.

[21] Appl. No.: 08/972,770

[22] Filed: Nov. 18, 1997

[51] Int. Cl.[6] .............................. H03L 7/099; H03B 5/02
[52] U.S. Cl. ................................ 331/57; 331/34; 327/280
[58] Field of Search ................................ 331/57, 175, 34; 327/156, 280, 281

[56] References Cited

U.S. PATENT DOCUMENTS 5,477,182  12/1995  Huizer ...................................... 327/261
5,748,048  5/1998  Moyal ........................................ 331/34

*Primary Examiner*—Arnold Kinkead
*Attorney, Agent, or Firm*—Wagner, Murabito & Hao

[57] ABSTRACT

The present invention comprises a voltage controlled oscillator (VCO) circuit having high power supply noise rejection. The circuit of the present invention includes an amplifier having positive, negative, and output terminals. A VCO input is coupled to the positive terminal for receiving a control voltage. A replica circuit is coupled to the negative terminal. A replica source follower transistor is coupled to the output terminal and is also coupled to the replica circuit. The replica source follower transistor transmits a replica current from a power supply to the replica circuit and is controlled by the amplifier. The present invention also includes a first and second VCO cell. The first VCO cell and the second VCO cell are both coupled to the replica circuit and to each other and the second VCO cell includes a VCO output for transmitting a VCO output signal. The first and second source follower transistors are respectively coupled to the first and second VCO cells to provide a respective first and second current from the power supply. The output terminal from the amplifier is coupled to control the replica source follower transistor, the first source follower transistor, and the second source follower transistor. The negative terminal of the amplifier receives feedback from the replica circuit such that the replica current, the first current, and the second current are insensitive to noise on the power supply, and such that the output signal is stable regardless of the noise on the power supply.

20 Claims, 8 Drawing Sheets

100

VCO WITH LOCAL FEEDBACK FOR LOW POWER SUPPLY NOISE SENSITIVITY

TECHNICAL FIELD

The present invention relates to the field voltage controlled oscillators. More particularly, the present invention relates to a voltage controlled oscillator (VCO) having a low sensitivity to noise on its power supply.

BACKGROUND ART

Voltage controlled oscillators (VCOs) are well known and widely used in the electronics industry. Within the digital communications field, VCOs are used in a variety of applications. Such applications include, for example, frequency synthesizers, signal generation (e.g., serial transmission clock recovery), and the like. VCOs are typically designed to perform within a given set of boundary conditions and to perform to a specified standard. Typical conditions include, for example, performance over operating temperature ranges, sensitivity to vibration, output sensitivity to interference, and the like. Typical performance standards include, for example, output signal frequency stability, output signal programmability, and the like.

A typical prior art VCO generates an oscillating output signal having a specified frequency. The signal can have several different wave forms (e.g., square, saw tooth, triangular, etc.). The frequency of the output is tunable and is a function of an input voltage, an external resistance or capacitance, or the like. The type of application in which the VCO is used dictates its operating conditions and performance requirements. However, as in most VCO applications, it is usually important that the output frequency of the VCO is stable and is a consistent function of the control inputs (e.g., voltage, capacitance, and the like).

For example in a case where a prior art VCO is used in an application for clock recovery in a serial transmission system, it is important that the output frequency remain stable. The output frequency is used to reconstruct a serial transmission clock signal, which in turn, is used to sample data on a serial transmission line. Distortion or variation in the VCO output frequency, and hence, the reconstructed clock signal, could lead to sampling errors, lost data, decreased throughput, or other such problems. Consequently, for these applications it is important that the VCO provide a very stable, noise free output signal having a controlled frequency.

One of the main problems prior art VCOs need to contend with is power supply noise. Noise, especially low frequency noise, in the power supply can have a detrimental effect on the VCO's output stability. As a typical VCO draws current from a power supply, the low frequency noise with this current (or voltage), or noise from other external devices (e.g., electromagnetic interference), can affect the output frequency. Such noise typically manifests itself as jitter on the rising and falling edges of the output signal, frequency skew in the output signal, or other distortions in the fidelity of the output.

Power supplies for VCOs are carefully filtered to remove this problematic noise. While higher frequencies are somewhat easier to remove, low frequency noise has proven more difficult and more expensive (e.g., with respect to silicon area or circuit board space) to remove. In addition, in most VCOs, a large portion of their circuitry is devoted to power supply noise rejection in order to enhance the stability of the output. These solutions are partially effective, however, as applications have become more complex and as noise sensitivity has increased with increasing levels of integration, power supply noise, particularly low frequency power supply noise, remains problematic.

Thus, what is required is a circuit which solves the power supply noise problems associated with the prior art. The required circuit should not be adversely affected by low frequency noise in the power supply. The required circuit should exhibit higher power supply noise rejection. The present invention provides a novel solution to the above requirements.

DISCLOSURE OF THE INVENTION

The present invention provides a solution which solves the power supply noise problems associated with the prior art. The present invention is not adversely affected by low frequency noise in the power supply. In addition, the present invention exhibits higher power supply noise rejection than prior art VCOs.

In one embodiment, the present invention comprises a voltage controlled oscillator (VCO) circuit having high power supply noise rejection. The circuit includes an amplifier having positive, negative, and output terminals. A VCO input is coupled to the positive terminal for receiving a control voltage. A replica circuit is coupled to the negative terminal. A replica source follower transistor is coupled to the output terminal and is also coupled to the replica circuit. The replica source follower transistor transmits a replica current from a power supply to the replica circuit and is controlled by the amplifier. The present invention also includes a first and second VCO cell. The first VCO cell and the second VCO cell are both coupled to the replica circuit and to each other and the second VCO cell includes a VCO output for transmitting a VCO output signal. The first and second source follower transistors are respectively coupled to the first and second VCO cells to provide a respective first and second current from the power supply. The output terminal from the amplifier is coupled to control the replica source follower transistor, the first source follower transistor, and the second source follower transistor. The negative terminal of the amplifier receives feedback from the replica circuit such that the replica current, the first current, and the second current are insensitive to noise on the power supply, and such that the output signal is stable regardless of the noise on the power supply.

In addition, the present invention is readily suited to the use of differing replica circuit configurations in order to optimize the VCO for the particular use contemplated. For example, in one configuration, the VCO of the present invention includes a replica circuit optimized to provide superior frequency response, while in another configuration, the VCO includes a replica circuit optimized to provide a lower output signal voltage swing for superior high speed operation. In so doing, the present invention exhibits higher power supply noise rejection than prior art VCOs and allows its operating configuration and characteristics to be adjusted depending upon the requirements of a particular application.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, a voltage controlled oscillator having a low sensitivity to power supply noise, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention provides a solution which solves the power supply noise problems associated with the prior art. The present invention is not adversely affected by low frequency noise in the power supply. In addition, the present invention exhibits higher power supply noise rejection than prior art VCOs. Hence, VCOs in accordance with the present invention are well suited for applications requiring exacting VCO performance. The present invention and its benefits are further described below.

Figure 1:
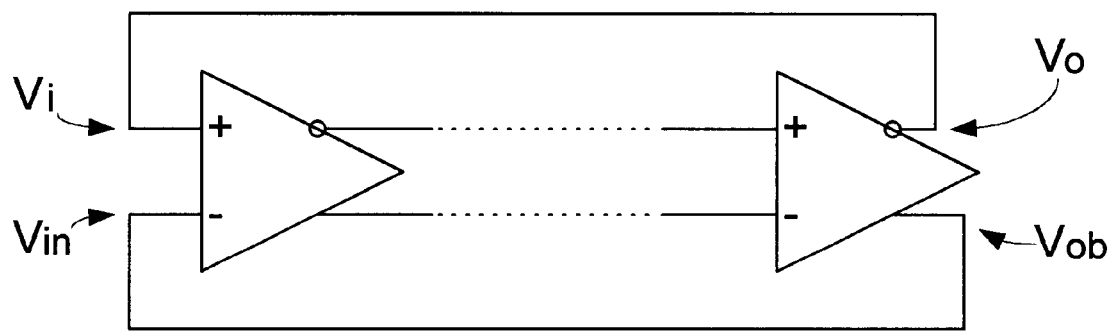
FIG. 1 shows a schematic block diagram of a VCO in accordance with one embodiment of the present invention.

FIG. 1 shows a schematic block diagram of a VCO 100 in accordance with one embodiment of the present invention. VCO 100 illustrates the general scheme of operation of the present invention. VCO 100 is comprised of a plurality of inverters coupled to form a "chain" where the output of the first inverter is coupled to the input of the second inverter, and so on throughout the chain. Each inverter has a positive and a negative input and a corresponding positive and negative output. The first inverter, e.g., inverter 101 of VCO 100 has its outputs coupled to the inputs of the next inverter, and so on, until the last inverter 120 in the chain is coupled. The plurality of inverters between inverter 101 and 120 are represented by dotted lines. The outputs of the last inverter 120 are coupled to the inputs of the first inverter 101. The resulting feed back effects an oscillation within VCO 100. The number of inverters included in VCO 100 largely determines the resulting natural frequency of oscillation and the total gain. The frequency of oscillation is variable over a range. The degree of variation is determined by the application of a control voltage to the circuitry comprising each inverter. Feedback to the inputs Vi and $Vi_n$ from the outputs Vo and $Vo_b$ sustain the oscillation. The output signal of VCO 100 is typically taken from the outputs Vo and Vob of the last inverter, inverter 120.

Figure 2:
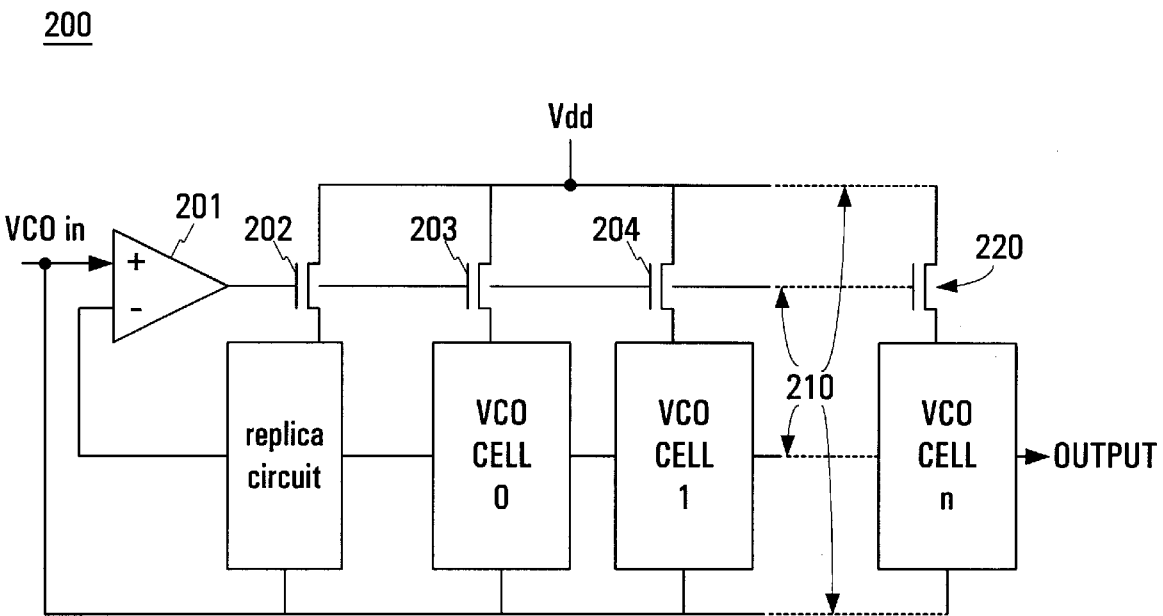
FIG. 2 shows a more detailed block diagram of a VCO in accordance with one embodiment of the present invention.

VCO 100 functions by maintaining a stable, predictable, output signal at Vo and $Vo_b$ having a frequency which corresponds to an externally applied control voltage (shown in FIG. 2). The frequencies at Vo and $Vo_b$ are substantially the same except for being opposite in phase. The present invention functions by ensuring the output signal taken from Vo and Vob remains stable and unaffected by noise on a power supply for the inverters 101–120.

Referring now to FIG. 2, a more detailed block diagram of a VCO 200 in accordance with present invention is shown. VCO 200 includes a plurality of VCO cells coupled together, in the same manner as inverters 101–120 of VCO 100. The first VCO cell, VCO cell 0, is coupled to VCO cell 1, and so on, through the last VCO cell in the chain, VCO cell n. The plurality of VCO cells (not shown) between VCO cell 1 and VCO cell n are similarly coupled via dotted lines 210. As with the number of inverters in VCO 100, the number of VCO cells in VCO 200 largely determines the resulting natural frequency of oscillation and the total gain of VCO 200. And, similarly to the outputs of VCO 100, the output of VCO 200 taken from the VCO cell coupled furthest from the control voltage input (e.g., VCO cell n). It should be appreciated, however, that the outputs of VCO 200 can be taken from any one of the VCO cells in the chain. Alternatively, several VCO cells, or even all VCO cells, of VCO 200 can be coupled to provide a suitable output, depending upon the particular requirements of an application.

VCO 200, in accordance with the present embodiment, includes an amplifier 201. The output of amplifier 201 is coupled to each of source follower transistors 202, 203, 204, and so on, through to source follow transistor 220 (e.g., where each of VCO cells 0 through n have a respective corresponding source follower transistor). Each of the source follower transistors 202–220 have their respective drains coupled to Vdd (e.g., 3.3 v power supply) and their respective sources coupled to their respective VCO cells, except in the case of source follower transistor 202, where a replica circuit is coupled, as opposed to a VCO cell. The replica circuit is designed to match the current and voltage characteristics a typical VCO cell (e.g., VCO cell 0). The replica circuit is coupled to VCO cell 0 as if it where a typical VCO cell. The replica circuit functions by providing negative feed back to amplifier 201, which in turn controls the voltage at the gates of source follower transistors 202–220. $VCO_{in}$ is the control voltage for VCO 200. $VCO_{in}$ controls the frequency of oscillation.

The replica circuit is designed and fabricated to match the current and voltage characteristics of each of the VCO cells 0 through n. Consequently, negative feed back from the replica circuit causes matching corresponding corrections for each VCO cell. For example, as the VCO cells 0 through n oscillate, they draw current from Vdd via source follower transistors 203–220. Each of the source follower transistors 203–220 has a high impedance. Hence, the source follower transistors 203–220 function by isolating noise on Vdd from the VCO cells. To further increase the impedance, amplifier 201 is coupled to the gates of source follower transistors 203–220. The output of amplifier 201 is controlled in part by the feed back from the replica circuit. The replica circuit is coupled to source follower transistor 202. Since the replica circuit matches the voltage and current characteristics of the VCO cells (e.g., VCO cell 0), the current flowing through source follower transistor 202 and the replica circuit will closely match the currents in the other VCO cells. Thus, by using negative feed back from the replica circuit, amplifier 201 adjusts the voltage at the gates of source follower transistors 202–220, effectively increasing their impedance. Since the replica circuit and each VCO cell is coupled to Vdd, any perturbation (e.g., a voltage spike) in Vdd affects them equally, and hence, the feed back from the replica circuit causes an equal correction. This provides much greater isolation from noise, including the particularly problematic low frequency noise, on Vdd.

Figure 3A:
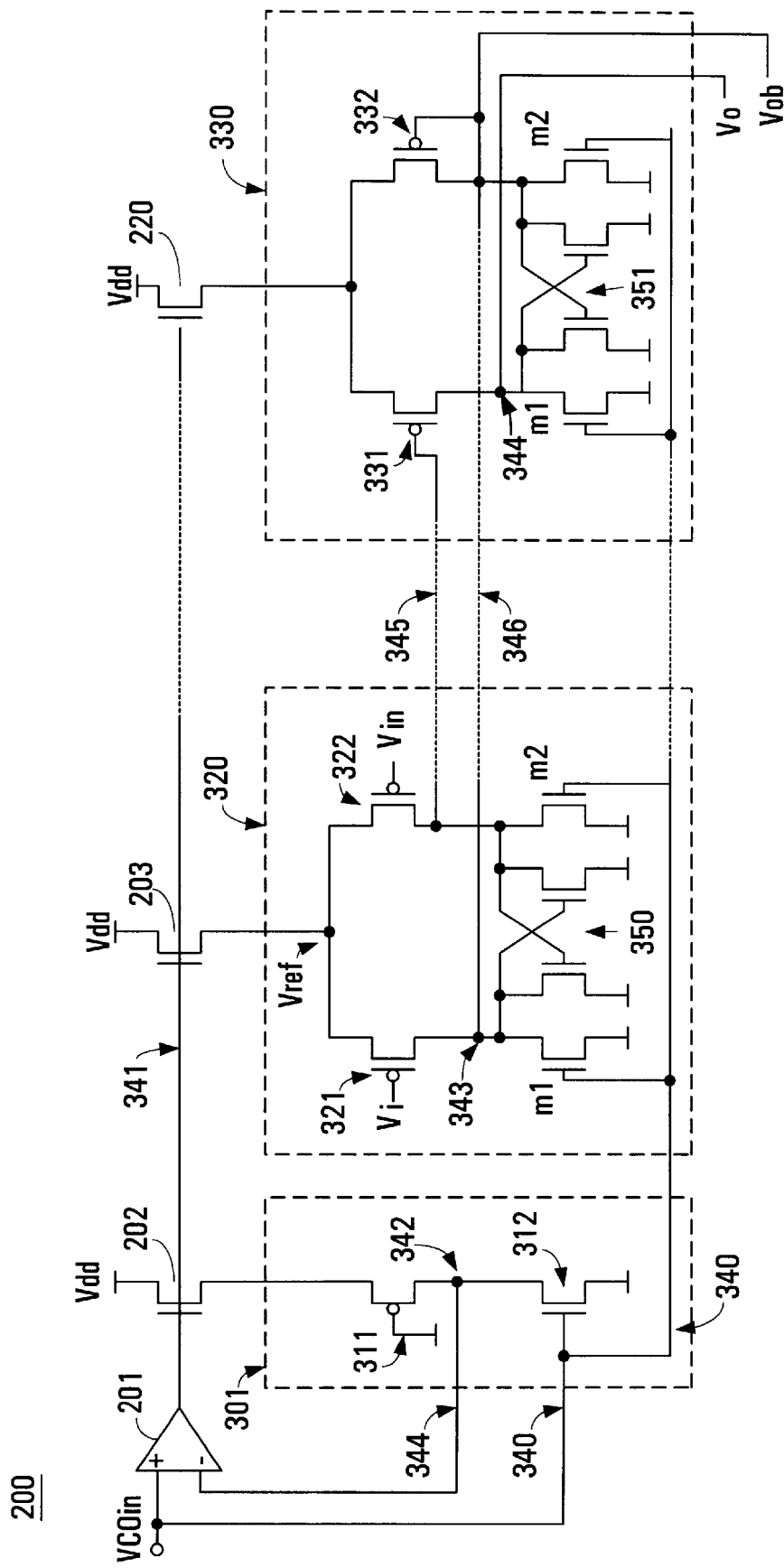
FIG. 3A shows a circuit diagram of the components comprising the VCO from FIG. 2.

FIG. 3A shows a circuit diagram of VCO 200. Replica circuit 301 corresponds to the replica circuit (from FIG. 2), VCO cell 320 corresponds to VCO cell 0, and VCO cell 330 corresponds to VCO cell n. VCO cell includes a transistor 321 and a transistor 322, both coupled to Vdd through source follower transistor 203. Voltages Vi and $Vi_n$ are respectively coupled to transistors 321–322. A load transistor m1 and a load transistor m2 are respectively coupled between transistors 321–322 and line 340. Transistors m1 and m2 are also coupled to cross-connected transistors 350. VCO cell 330 is similarly constructed, including transistors 331 and 332, respective load transistors m1 and m2, and cross-connected transistors 351. VCO cell 330 also includes an output Vo and Vob.

As described above, a plurality of VCO cells (and their corresponding source follower transistors) are coupled between VCO cell 320 and VCO cell 330, along lines 341, 345, 346, and 340. Each of the plurality of VCO cells are coupled to lines 341, 345, 346, and 340 in a manner similar to VCO cell 330, as represented by the dashed portions of lines 341, 345, 346, and 340.

Replica circuit 301 includes a transistor 311 and a transistor 312. Transistor 311 is coupled to Vdd via source follower transistor 202. The source of transistor 312 is coupled to ground. Line 341 couples the output of amplifier 201 to the gates of source follower transistors 202–220. Line 344 couples the negative terminal of amplifier 201 to a node 342 between transistor 311 and transistor 312. Node 342 is similar to a node 343 in VCO cell 320 and a node 344 in VCO cell 330.

Referring still to FIG. 3A, in the present embodiment, each VCO cell, for example, VCO cell 320, functions as a differential inverter having p-channel inputs (e.g., Vi and Vin) and n-channel loads (e.g., m1 and m2). The voltage inputs Vi and $Vi_n$ are applied to the gates of the n-channel loads and the cross connected transistors 350 are used to increase gain. The voltage at the node above transistor 321 and 322 is referred to as a reference voltage Vref. Where Vref is isolated and independent of Vdd, the power supply rejection ratio of VCO 200 is ideal. In the present embodiment, Vref is isolated from Vdd by source follower transistor 203 and transistor 321. By effecting a high impedance at the drain of source follower transistor 203, changes in Vdd have little effect on Vref. Amplifier 201 controls the voltage at the gate of source follower transistor 321 to maximize the impedance of source follower transistor 203. Amplifier 201 controls the voltage at the gate of source follower transistor 203 through the use of replica circuit 301 and negative feed back on line 344. As described above, the gates of each of source follower transistors 202–220 are coupled to the output of amplifier 201 via line 341. The voltage at node 342 is coupled to the negative terminal of amplifier 201, which consequently adjusts the voltage on line 341, such that a very stable equilibrium is maintained at node 342. In this manner, the action of amplifier 201 "multiplies" the impedance of source follower transistor 202, and thus, each of transistors 203–220.

For example, the effective impedance of source follower transistor 202, without the action of amplifier 201, is described by equation 1:

Equation 1: $R_o$ is approximately equal to $r_o(1+g_m R)$ where $r_o$ is the output impedance of the source follower transistor, $g_m$ is the transconductance of the source follower transistor, and R is the equivalent resistance of the VCO cell.

Accounting for the action of amplifier 201, the effective output impedance of source follower transistor 202 is described by equation 2:

Equation 2: $R_o$ is approximately equal to $r_o(1+g_m R A_v)$ where Av is the gain of amplifier 201.

Thus, as shown by equation 2, the impedance at the drain of source follower transistor 202 (and thus transistors 203–220) is greatly increased by amplifier 201. This causes changes on Vdd to have much less effect on the voltage at Vref, thus, isolating each VCO cell (e.g., VCO cell 320) from Vdd noise.

In addition to the action of amplifier 201 and source follower transistors 202–220, the power supply rejection ratio of VCO 200 is further increased by coupling VCOin directly to the gates of m1 and m2 of each VCO cell (e.g., VCO cell 320) via line 340. As described above, Vi and $Vi_n$ are coupled to Vo and $Vo_b$ of the adjacent VCO cells. The transistors m1 and m2 operate in their saturation regions most of the period in which they are on while transistors 321 and 322 operate in their linear regions. Thus, changes in Vref, which cause changes in Vds of transistors m1 and m2, have a second order effect on the current flowing through m1 and m2. For example, the frequency of VCO 200 is determined by the total current flowing through each VCO cell (e.g., VCO cell 320). The current in each VCO cell is set by the action of transistors m1 and m2. Since the voltage at the gates of m1 and m2 is set by $VCO_{in}$, irrespective of Vdd, the power supply rejection ration is further increased. In the present embodiment, Vgs for transistors m1 and m2 is independent from Vdd.

It should be noted that during transition, for a short period of time, transistors m1 and m2 transfer to their linear regions, cross coupled transistors 350 conduct current, and transistors 321 and 322 transfer to their saturation region. At such a time, changes in Vdd could conceivably have an effect. However, such changes are compensated for by the negative feedback action of amplifier 201 and source follower transistors 202–220. Depending upon the particular application in which VCO 200 is used, different replica circuits are utilized to optimize VCO 200 for the requirements of the application.

Figure 3B:
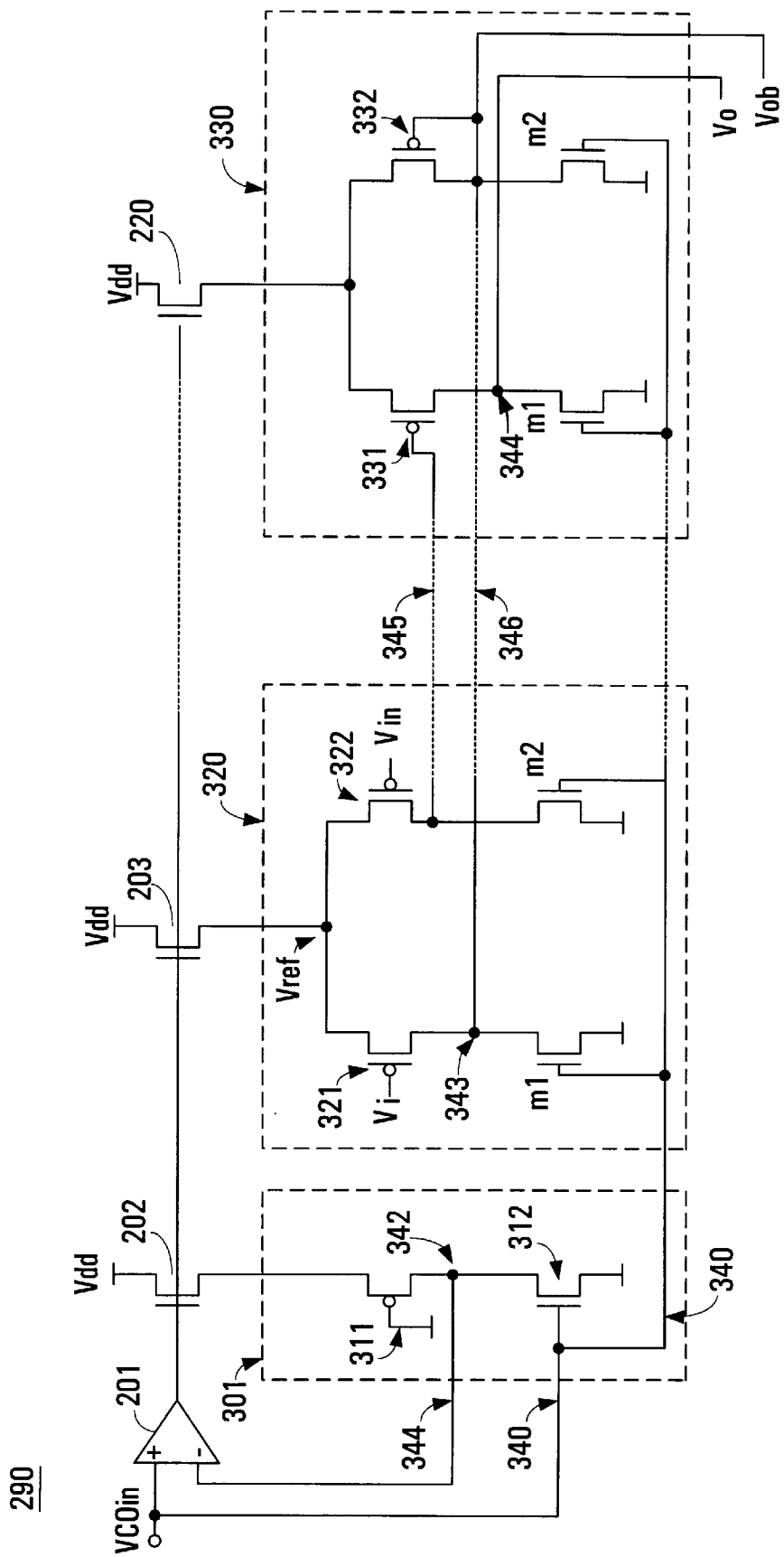
FIG. 3B shows a circuit diagram of the components comprising an alternative embodiment of the VCO from FIG. 2.

FIG. 3B shows a VCO 290 in accordance with an alternate embodiment of the present invention. VCO 290 is similar to VCO 200 except that the cross coupled transistors in each VCO cell (e.g., cross coupled transistors 350 and 351) are eliminated. In other respects, VCO 290 functions similarly to VCO 200.

Figure 4:
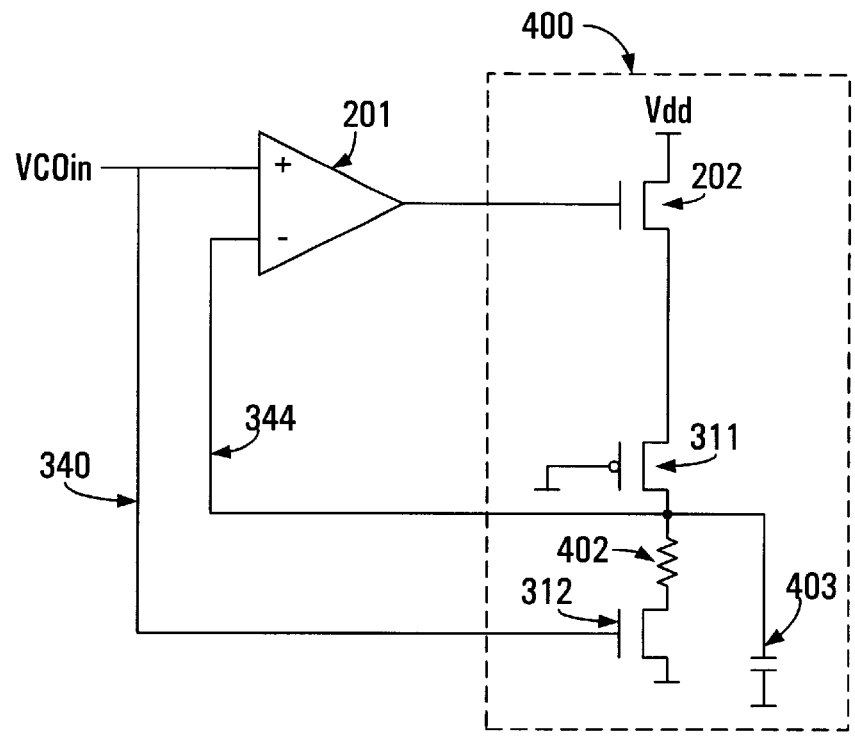
FIG. 4 shows a replica circuit in accordance with a first alternate embodiment of the present invention.

With reference now to FIG. 4, a replica circuit 400 (shown including source follower transistor 202) in accordance with a first alternate embodiment of the present invention is shown. Replica circuit 400 is coupled to VCO 200 in a manner similar to replica circuit 301, however, replica circuit 400, a resistor 402, and a capacitor 403. VCOin is applied to the positive terminal of amplifier 201. Capacitor 403 combines with resistor 402 to form an RC time constant which improves the frequency response of VCO 200. Alternatively, a transistor operating in its linear region can be used as resistor 402. Incorporating replica circuit 400 allows VCO 200 to operate with greater stability in the presence of very high frequency noise on Vdd.

Figure 5:
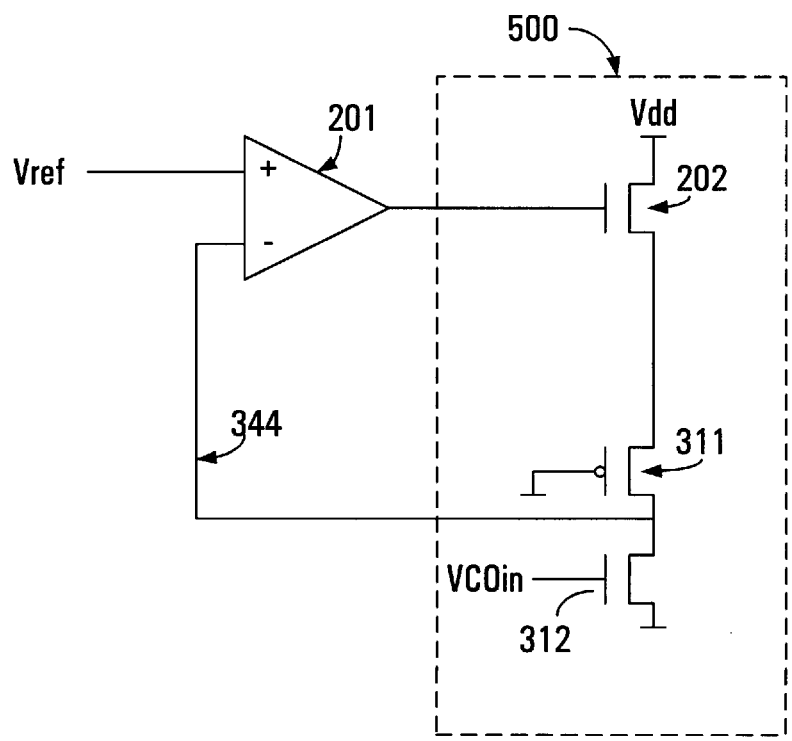
FIG. 5 shows a replica circuit in accordance with a second alternate embodiment of the present invention.

FIG. 5 shows a replica circuit 500 (shown including source follower transistor 202) in accordance with a second alternate embodiment of the present invention. Replica circuit 500 is similar to replica circuit 400. However, replica circuit 500 omits resistor 402 and capacitor 403 and couples $VCO_{in}$ to the gate of transistor. In addition, Vref is applied to the positive terminal of amplifier 201. Replica circuit 500 functions by limiting the total voltage swing of outputs Vo and $Vo_b$ during a period of oscillation. In so doing, VCO 200 incorporating replica circuit 500 can operate at higher speeds (e.g., higher frequencies).

Figure 6:
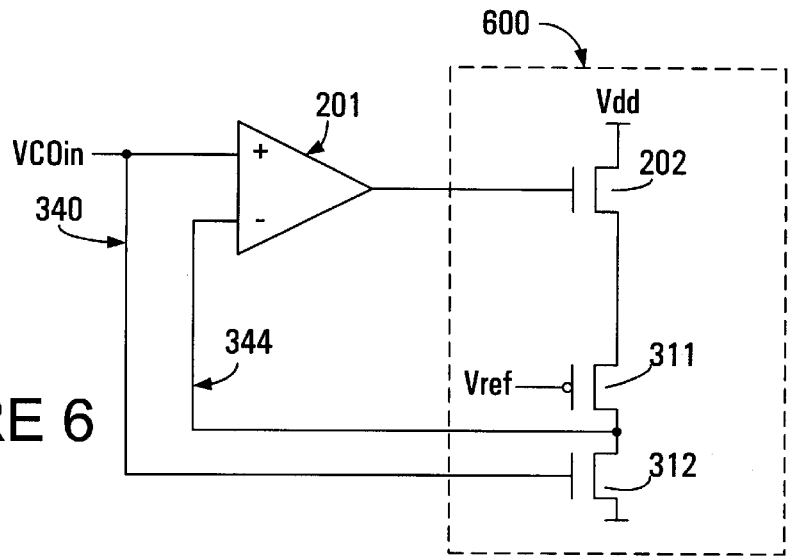
FIG. 6 shows a replica circuit in accordance with a third alternate embodiment of the present invention.

FIG. 6 shows a replica circuit 600 (shown including source follower transistor 202) in accordance with a third alternate embodiment of the present invention. Replica circuit 600 is similar to replica circuit 301. However, replica circuit 600 couples VCOin to the positive terminal of amplifier 201 and couples Vref to the gate of transistor 311. Replica circuit 600 functions by providing more "headroom" across source follower transistor 202, transistor 311, and transistor 312. Hence, replica circuit 600 improves the performance of VCO 200 in low power applications.

Figure 7:
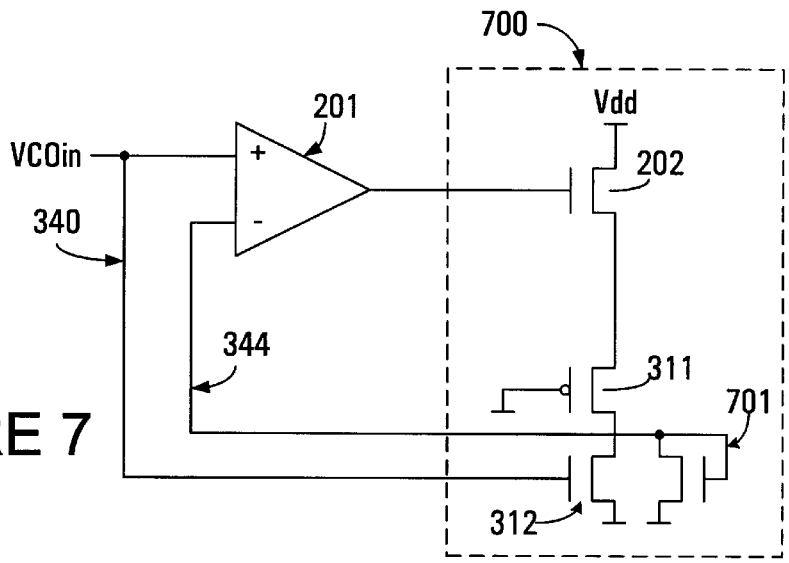
FIG. 7 shows a replica circuit in accordance with a fourth alternate embodiment of the present invention.

FIG. 7 shows a replica circuit 700 (shown including source follower transistor 202) in accordance with a fourth alternate embodiment of the present invention. Replica circuit 700 is similar to replica circuit 600 except that replica circuit 700 includes transistor 701, couples the gate of transistor 311 to ground, and eliminates capacitor 401. Replica circuit 700 functions by lowering the impedance at the negative terminal, improving the stability of the VCO.

Figure 8:
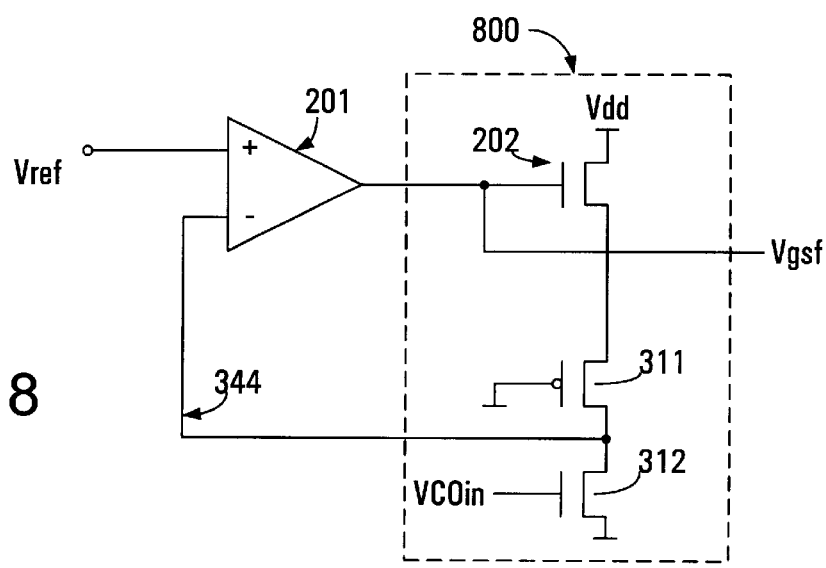
FIG. 8 shows a replica circuit in accordance with a fifth alternate embodiment of the present invention.

FIG. 8 shows a replica circuit 800 (shown including source follower transistor 202) in accordance with a fifth alternate embodiment of the present invention. Replica circuit 800 is similar to replica circuit 500 except that negative feed back is taken from the source of transistor 311. Replica circuit 800 functions by providing an increased power supply rejection ratio.

Figure 9:
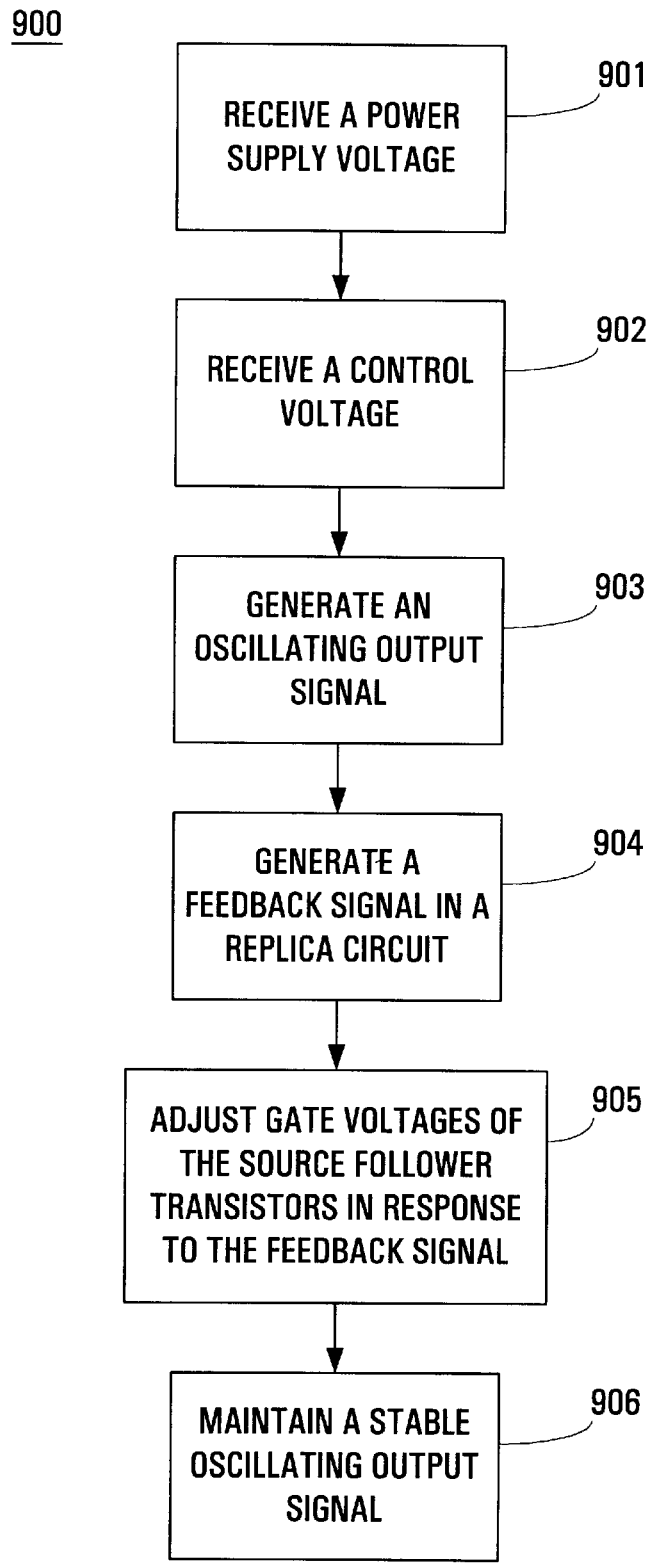
FIG. 9 shows a flow chart of the steps of a process in accordance with one embodiment of the present invention.

FIG. 9 shows a flow chart of the steps of a process 900 in accordance with one embodiment of the present invention. Process 900 begins in step 901, where a VCO (e.g., VCO 200 from FIG. 3A) receives a power supply voltage Vdd. VCO 200 is coupled to Vdd via a plurality of included source follower transistors (e.g., source follower transistors 202–220). The current from Vdd sets up an internal oscillation.

In step 902, VCO 200 receives a control voltage input (e.g., $VCO_{in}$) from an external circuit. The control voltage input sets the frequency of oscillation within VCO 200. The frequency of oscillation is variable in response to changes in the control voltage.

In step 903, the oscillation described above is used to generate an oscillating output signal. As described above, in the present embodiment, the output signal is taken from one of the VCO cells in the VCO (e.g., VCO cell 330). A first output, Vo, and a second output, $Vo_b$, are coupled to VCO cell 330 such that $Vo_b$ is an inverted version of Vo (e.g., phase reversed).

In step 904, VCO 200, in accordance with the present invention, generates a feed back signal in a replica circuit (e.g., replica circuit 301). As described above, replica circuit 301 is designed to match the current and voltage characteristics of the other VCO cells (e.g., VCO cell 320) within VCO 200.

In step 905, the feed back provided by replica circuit 301 is used to adjust the voltage at the gates of each of source follower transistors 202–220, thereby increasing their impedance, and thus, the insensitivity of VCO 200 to Vdd noise. The feed back signal is coupled to the negative terminal of an amplifier (e.g., amplifier 201). The output of the amplifier is coupled to the gates of each of the source follower transistors 202–220.

Hence, in step 906, VCO 200, in accordance with the present invention maintains a stable oscillating output signal, impervious to noise on Vdd. The output signal retains its stability due to the fact that VCO 200, as described above, rejects noise on Vdd.

Figure 10:
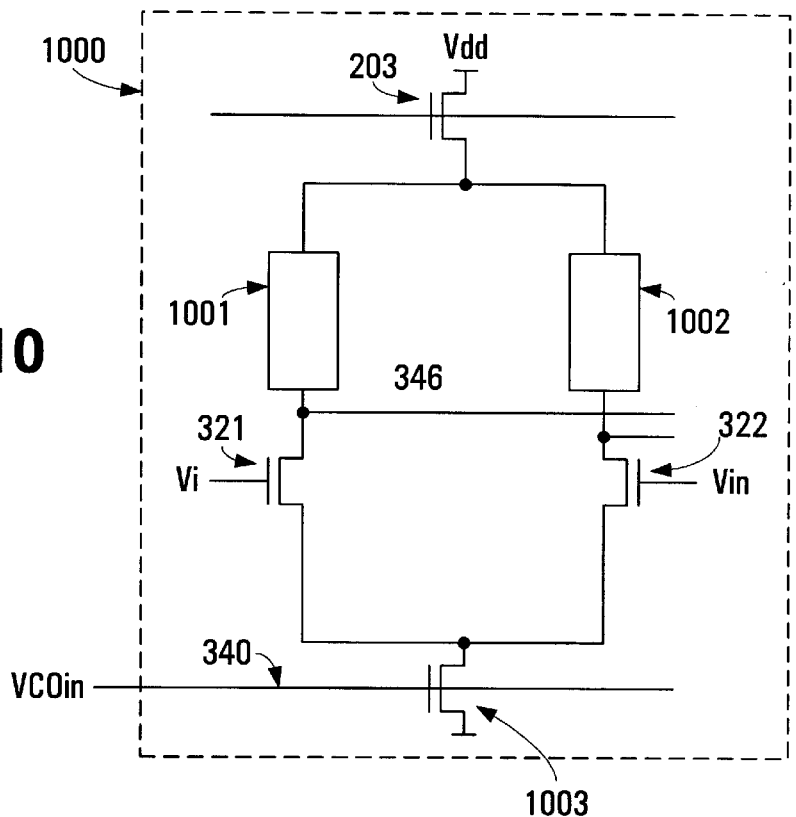
FIG. 10 shows a VCO cell in accordance with an alternative embodiment of the present invention.

Referring now to FIG. 10, a VCO cell 1000 in accordance with an alternative embodiment of the present invention is shown. VCO cell 1000 is similar to the VCO cells of VCO 200 (e.g., VCO cell 320) and functions in a similar manner. However, VCO cell 1000 includes a first load element 1001 and a second load element 1002 coupled above transistors 321 and 322. VCO cell 1000 also includes a transistor 1003. The gate of transistor 1003 is coupled to line 340 to receive VCOin. In so doing, transistor 1003 functions as a current source for VCO cell 1000. The load elements 1001 and 1002 comprise loads (e.g., diode coupled n channel transistors, resistors, or the like) between transistor 203 and transistors 321 and 322. VCO cell 1000 is utilized in cases where higher operating frequency is desired.

Figure 11:
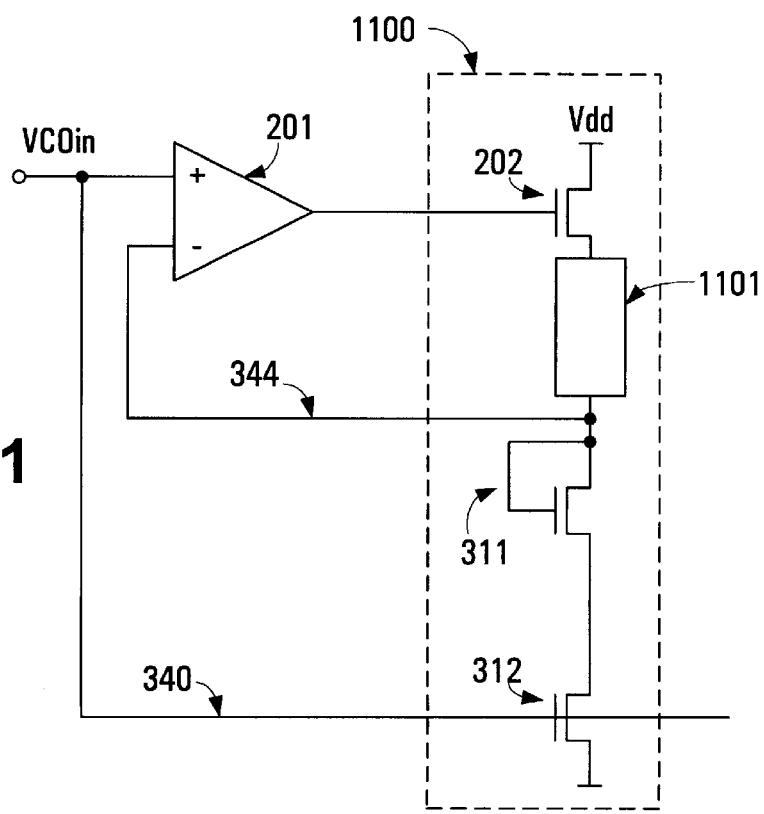
FIG. 11 shows a replica circuit embodiment for use with the VCO cell from FIG. 10.

FIG. 11 shows a replica circuit 1100 in accordance with yet another alternative embodiment of the present invention. Replica circuit 1100 is typically utilized in conjunction with VCO cell 1000. Replica circuit 1100 is similar to replica circuit 301 and functions in a similar manner. However, replica circuit 1100 includes a load element 1101 (e.g., a diode coupled n channel transistor, a resistor, or the like) between transistor 202 and transistor 311. As with VCO cell 1000, replica circuit 1100 is utilized in cases where higher operating frequency is desired.

Thus, the present invention provides a solution which solves the power supply noise problems associated with the prior art. The present invention is not adversely affected by low frequency noise in the power supply. In addition, the present invention exhibits higher power supply noise rejection than prior art VCOs.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A voltage controlled oscillator (VCO) circuit, comprising:

an amplifier having a positive terminal, a negative terminal and an output terminal;

a VCO input coupled to said positive terminal for receiving a control voltage;

a replica circuit coupled to said negative terminal;

a replica source follower transistor for transmitting a replica voltage from a power supply to said replica circuit;

a first VCO cell coupled to said replica circuit;

a second VCO cell coupled to said first VCO cell and said replica circuit, said second VCO cell having a VCO output for transmitting a VCO output signal;

a first source follower transistor coupled to said first VCO cell to transmit a first voltage from said power supply to said first VCO cell;

a second source follower transistor coupled to said second VCO cell to transmit a second voltage from said power supply to said second VCO cell, said output terminal coupled to control said replica source follower transistor, said first source follower transistor, and said second source follower transistor, said negative terminal receiving feedback from said replica circuit, wherein said replica circuit adjusts said feedback to compensate for noise on said power supply; and a first and second load transistor included in each of said first and second VCO cells, said first and second load transistors coupled to directly receive said VCO input independent of said power supply such that said VCO output signal is insensitive to noise on said power supply.

2. The oscillator circuit of claim 1, further comprising:

a first and second voltage input included in each of said first VCO cell and said second VCO cell;

a first and second voltage output included in each of said first VCO cell and said second VCO cell; said first and second voltage output of said first VCO cell respectively coupled to said first and second voltage input of said second VCO cell and said first and second voltage output of said second VCO cell respectively coupled to said first and second voltage input of said first VCO cell to sustain an oscillation within said VCO circuit.

3. The oscillator circuit of claim 1, wherein said VCO input is coupled to said positive terminal of said amplifier and said VCO input is coupled to said first and said second VCO cell to control the frequency of said VCO output signal.

4. The oscillator circuit of claim 1, wherein said output terminal of said amplifier is respectively coupled to the gate of said first and said second source follower transistors to increase an impedance of said first and said second source follower transistors.

5. The oscillator circuit of claim 1, wherein said replica circuit is a frequency response optimized replica circuit to improve the frequency response of said VCO circuit.

6. The oscillator circuit of claim 1, wherein said replica circuit is a high speed optimized replica circuit including to improve the speed of said VCO circuit.

7. The oscillator circuit of claim 1, wherein said replica circuit is an improved headroom replica circuit to improve operation of said VCO circuit while operating at low voltage.

8. The oscillator circuit of claim 1, wherein said replica circuit is an improved stability replica circuit which improves stability of said VCO circuit.

9. A voltage controlled oscillator (VCO) circuit, comprising:

an amplifier having a positive terminal, a negative terminal and an output terminal;

a VCO input coupled to said positive terminal for receiving a control voltage;

a replica circuit coupled to said negative terminal;

a replica source follower transistor for transmitting a replica voltage from a power supply to said replica circuit;

a first VCO cell coupled to said replica circuit, said first VCO cell including a first and second load transistor;

a second VCO cell coupled to said first VCO cell and said replica circuit, said second VCO cell having a VCO output for transmitting a VCO output signal, said second VCO cell including a third and fourth load transistor;

a first source follower transistor coupled to said first VCO cell to transmit a first voltage from said power supply to said first VCO cell;

a second source follower transistor coupled to said second VCO cell to transmit a second voltage from said power supply to said second VCO cell; and said output terminal of said amplifier is respectively coupled to the gate of said first and said second source follower transistors to increase an impedance of said first and said second source follower transistors, said negative terminal receiving feedback from said replica circuit wherein said replica circuit adjusts said feedback to compensate for noise on said power supply, said VCO input coupled to said positive terminal of said amplifier and to said first and second load transistors and said third and fourth load transistors such that said replica voltage, said first voltage, said second voltage, and said VCO output signal are insensitive to noise on said power supply.

10. The oscillator circuit of claim 9, further comprising:

a first and second voltage input included in each of said first VCO cell and said second VCO cell;

a first and second voltage output included in each of said first VCO cell and said second VCO cell;

said first and second voltage output of said first VCO cell respectively coupled to said first and second voltage input of said second VCO cell and said first and second voltage output of said second VCO cell respectively coupled to said first and second voltage input of said first VCO cell to sustain an oscillation within said VCO circuit.

11. The oscillator circuit of claim 9, wherein said replica circuit is a frequency response optimized replica circuit to improve the frequency response of said VCO circuit.

12. The oscillator circuit of claim 9, wherein said replica circuit is a high speed optimized replica circuit including to improve the speed of said VCO circuit.

13. The oscillator circuit of claim 9, wherein said replica circuit is an improved headroom replica circuit to improve operation of said VCO circuit while operating at low voltage.

14. The oscillator circuit of claim 9, wherein said replica circuit is an improved power supply rejection ratio replica circuit to improve stability of said VCO circuit.

15. In a voltage controlled oscillator (VCO) circuit including a replica circuit coupled to a plurality of VCO cells, a method of maintaining a stable VCO output signal and rejecting noise on a coupled power supply, the method comprising the steps of:

a) receiving a control voltage at a VCO input coupled to a positive terminal of an amplifier, the amplifier having the positive terminal, a negative terminal and an output terminal;

b) transmitting a replica voltage from a power supply to a replica circuit using a replica source follower transistor, the replica circuit coupled to said negative terminal;

transmitting a VCO output signal from a VCO output, said VCO output included in a second VCO cell, the second VCO cell coupled to a first VCO cell and said replica circuit;

c) transmitting a first voltage from said power supply to said first VCO cell using a first source follower transistor coupled to said first VCO cell;

d) transmitting a second voltage from said power supply to said second VCO cell using a second source follower transistor coupled to said second VCO cell, said output terminal coupled to control said replica source follower transistor, said first source follower transistor, and said second source follower transistor, said negative terminal receiving feedback from said replica circuit, e) adjusting said feedback to compensate for noise on said power supply using said replica circuit; and f) receiving said VCO input independent of said power supply using a first and second load transistor included in each of said first and second VCO cells, said first and second load transistors coupled directly to said VCO input such that said VCO output signal is insensitive to noise on said power supply.

16. The method of claim 15, further comprising the step of generating an output via an amplifier responsive to said feed back signal to control the impedance of said source follower transistors, said output coupled to the gates of said source follower transistors.

17. The method of claim 15, wherein step f) further includes receiving said control voltage directly at said load transistors independent of said power supply voltage to reduce an affect of noise in said power supply voltage on said VCO output signal.

18. The method of claim 15 further comprising the step of tailoring said replica circuit to optimize said VCO circuit for a particular application.

19. The method of claim 15, wherein:

a first and second voltage input is included in each of said first VCO cell and said second VCO cell;

a first and second voltage output is included in each of said first VCO cell and said second VCO cell; and said first and second voltage output of said first VCO cell are respectively coupled to said first and second voltage input of said second VCO cell and said first and second voltage output of said second VCO cell respectively coupled to said first and second voltage input of said first VCO cell to sustain an oscillation within said VCO circuit.

20. The method of claim 15, wherein said output terminal of said amplifier is respectively coupled to the gate of said first and said second source follower transistors to increase an impedance of said first and said second source follower transistors.

* * * * *